United States Patent
Kang et al.

(10) Patent No.: US 7,843,736 B2
(45) Date of Patent: Nov. 30, 2010

(54) NONVOLATILE MEMORY DEVICE AND READ METHOD THEREOF

(75) Inventors: Hyung-Seok Kang, Yongin-si (KR);
Eui-Gyu Han, Yongin-si (KR);
Hoo-Sung Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 148 days.

(21) Appl. No.: 12/396,937

(22) Filed: Mar. 3, 2009

(65) Prior Publication Data

US 2009/0231922 A1 Sep. 17, 2009

(30) Foreign Application Priority Data

Mar. 14, 2008 (KR) .................. 10-2008-0023977

(51) Int. Cl.
*G11C 11/34* (2006.01)
(52) U.S. Cl. ............... 365/185.18; 365/189.09; 365/189.011
(58) Field of Classification Search ............ 365/185.18, 365/189.09, 189.011
See application file for complete search history.

(56) References Cited

U.S. PATENT DOCUMENTS 7,518,913 B2 * 4/2009 Wang et al. ............ 365/185.03

2004/0080979 A1 4/2004 Park

FOREIGN PATENT DOCUMENTS

| JP | 2001-167588 | 6/2001 |
|---|---|---|
| KR | 1020050098838 | 10/2005 |
| KR | 1020060021097 | 3/2006 |

OTHER PUBLICATIONS

English Abstract for Publication No.: 2001-167588.
English Abstract for Publication No.: 1020050098838.
English Abstract for Publication No.: 1020060021097.

* cited by examiner

*Primary Examiner*—Son Dinh
*Assistant Examiner*—Nam Nguyen
(74) *Attorney, Agent, or Firm*—F. Chau & Associates, LLC

(57) ABSTRACT

Disclosed is a read method of a non-volatile memory device which includes performing a first read operation in which a first read voltage is applied to a selected word line. If a read fail arises at the first read operation, a second read operation is performed in which a second read voltage lower than the first read voltage is applied to the selected word line. If no read fail arises at the second read operation, the read fail generated at the first read operation is cured by performing a program operation.

20 Claims, 6 Drawing Sheets

(a)

(b)

(c)

NONVOLATILE MEMORY DEVICE AND READ METHOD THEREOF

CROSS-REFERENCE TO RELATED APPLICATIONS

This application claims priority under 35 U.S.C. §119 of Korean Patent Application No. 10-2008-0023977 filed on Mar. 14, 2008, the entirety of which is hereby incorporated by reference.

BACKGROUND OF THE INVENTION

1. Technical Field

The present invention relates to a memory device, and more particularly, the present invention relates to a nonvolatile memory device and a read method for the nonvolatile memory device.

2. Discussion of the Related Art

Semiconductor memory devices are roughly classified into volatile memories such as DRAM, SRAM, and the like and non-volatile memories such as EPROM, FRAM, PRAM, MRAM, flash memory, and the like. Volatile memories lose contents stored therein at power-off, while non-volatile memories retain contents stored therein even at power-off. In particular, since flash memories are able to be programmed at a relatively high program speed, with low power consumption, and may be used to store a relatively large quantity of data, they have been widely used as storage medium of computer systems.

A flash memory has a memory cell array which stores data. The memory cell array consists of a plurality of memory blocks, each of which is divided into a plurality of pages. Each of the pages consists of a plurality of memory cells. In the flash memory, an erase operation may be performed one full block at a time and a write or read operation may be performed one full page at a time.

Memory cells in a flash memory may be either "ON" cells or "OFF" cells based upon their threshold voltages. The ON cells store data '1' and are called an 'erase cell'. The OFF cells store data '0' and are called a 'program cell'. The ON cells have a threshold voltage between −3V and −1V, and the OFF cells have a threshold voltage between +1V and +3V.

A flash memory includes cell strings (refer to FIG. 2), each of which includes a string select transistor connected to a string select line SSL, memory cells each connected to corresponding word lines WL0 to WL31, and a ground select transistor connected to a ground select line GSL. The string select transistors in the respective strings are connected to corresponding bit lines BL, and the ground select transistors therein are connected in common to a common source line CSL.

At a read operation, a selected word line is supplied with a select read voltage Vrd, and unselected word lines are supplied with an unselect read voltage Vread. Herein, the unselect read voltage Vread is a voltage high enough to turn on memory cells connected with unselected word lines.

An erroneous read operation in which cells programmed to an ON cell (data '1') are read as an OFF cell (data '0') may be referred to herein as a "read fail." A read fail may arise due to various causes at the read operation of a flash memory.

An example of one cause of a read fail is charge leakage. The read fail due to the charge leakage may arise when charge stored in a programmed cell is leaked into a channel. If the read fail arises due to charge leakage, a threshold voltage distribution of OFF cells programmed with data '0' is shifted into a threshold voltage distribution of ON cells (refer to FIG. 4).

If the charge leakage is sufficiently seriously, data stored in memory cells may be changed fully. For example, if the charge leakage arises to the extent that threshold voltages of programmed memory cells are lowered below a select read voltage Vrd (e.g., 0V), memory cells programmed with data '0' may be read as data '1'. The read fail due to charge leakage may arise frequently in Multi-Level Cell (MLC) flash memories capable of storing multi-bit data in each cell.

SUMMARY OF THE INVENTION

Exemplary embodiments of the present invention are directed to providing a non-volatile memory device and read method capable of reducing or preventing read fail due to charge leakage.

One aspect of the present invention is directed to provide a read method of a non-volatile memory device which includes performing a first read operation in which a first select read voltage is applied to a selected word line. If a read fail arises at the first read operation, a second read operation is performed in which a second select read voltage lower than the first select read voltage is applied to the selected word line. If no read fail arises, the read fail generated at the first read operation is cured by performing a program operation.

An aspect of the present invention is directed to provide a non-volatile memory device which includes a memory cell array for storing data. A read voltage generator provides a read voltage to a selected word line. A control unit controls the read voltage generator. The control unit performs a first read operation by controlling the read voltage generator so as to supply a first select read voltage to the selected word line. If a read fail arises at the first read operation, the control unit performs a second read operation by controlling the read voltage generator so as to provide a second select read voltage lower than the first select read voltage to the selected word line. If no read fail arises at the second read operation, the control unit cures the read fail generated at the first read operation by performing a program operation.

An aspect of the present invention is directed to provide a memory system which includes a non-volatile memory device. A memory controller controls the non-volatile memory device. The non-volatile memory device performs a first read operation by supplying a first select read voltage to a selected word line at a read operation. If a read fail arises at the first read operation, the non-volatile memory device performs a second read operation by providing a second select read voltage lower than the first select read voltage to the selected word line. If no read fail arises at the second read operation, the non-volatile memory device cures the read fail generated at the first read operation by performing a program operation.

BRIEF DESCRIPTION OF THE DRAWINGS

The above and other features and aspects of the exemplary embodiments of the present invention will be described with reference to the following figures, wherein like reference numerals may refer to like parts throughout the various figures. In the figures.

DETAILED DESCRIPTION OF EXEMPLARY EMBODIMENTS

Figure 1:
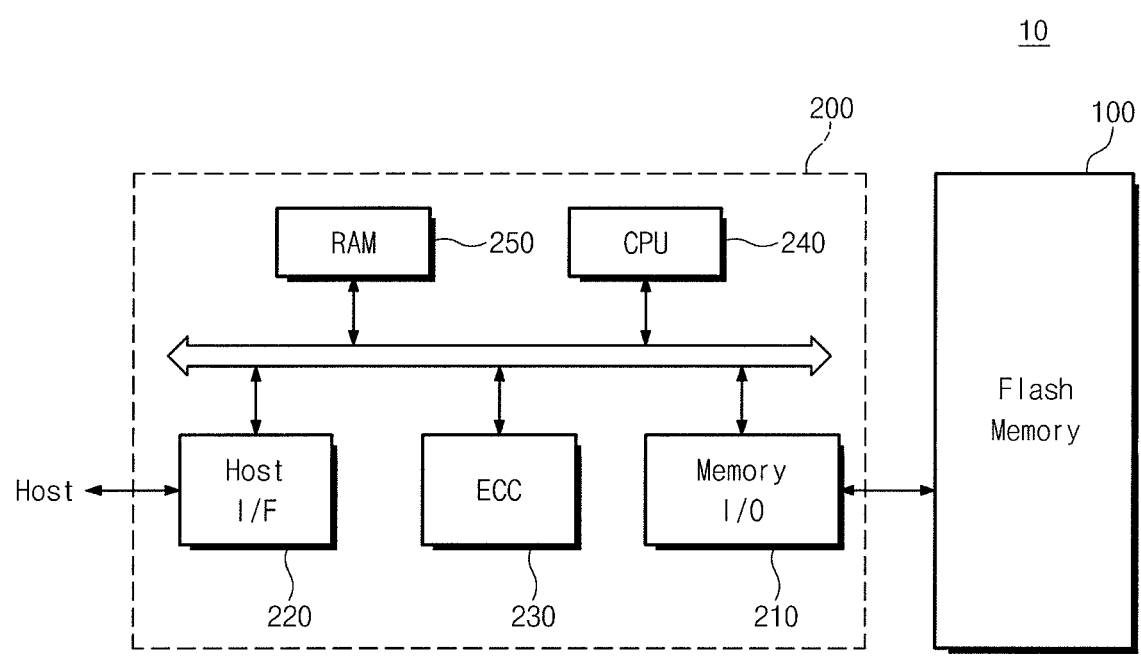
FIG. 1 is a block diagram showing a semiconductor memory device according to exemplary embodiments of the present invention.

Exemplary embodiments of the present invention will be described below in more detail with reference to the accompanying drawings. The present invention may, however, be embodied in different forms and should not be construed as limited to the embodiments set forth herein. Like reference numerals may refer to like elements throughout the accompanying figures.

FIG. 1 is a block diagram showing a semiconductor memory device according to exemplary embodiments of the present invention. Referring to FIG. 1, a semiconductor memory device 10 may include a flash memory 100 and a memory controller 200. Herein, the flash memory 100 is a non-volatile memory, and performs write, read, and erase operations according to the control of the memory controller 200. As would be obvious to one skilled in the art, operations of the flash memory 100 are not limited to this disclosure.

The memory controller 200 may provide a read command RD_CMD, an address ADDR, and control signals CTRL at a read operation to the flash memory 100. The flash memory 100 may supply a read voltage to a corresponding word line to the received address ADDR.

The memory controller 200 may include a memory interface 210, a host interface 220, an ECC circuit 230, CPU 240, and RAM 250. The RAM 250 may be used as a working memory of the CPU 240. The host interface 220 may utilize one or more protocols needed to exchange data with a host.

The ECC circuit 230 may be used to analyze and correct erroneous bits of data stored in the flash memory 100. The memory interface 210 is directly connected to the flash memory 100, and may be configured to provide a command, an address, data, and control signals to the flash memory 100 and to receive data from the flash memory 100. The CPU 240 may perform a whole control operation for data exchange of the memory controller 200. Although not illustrated in the figures, it would be obvious to one skilled in the art that the semiconductor memory device 10 may further comprise ROM capable of storing code data for interfacing with the host.

Figure 2:
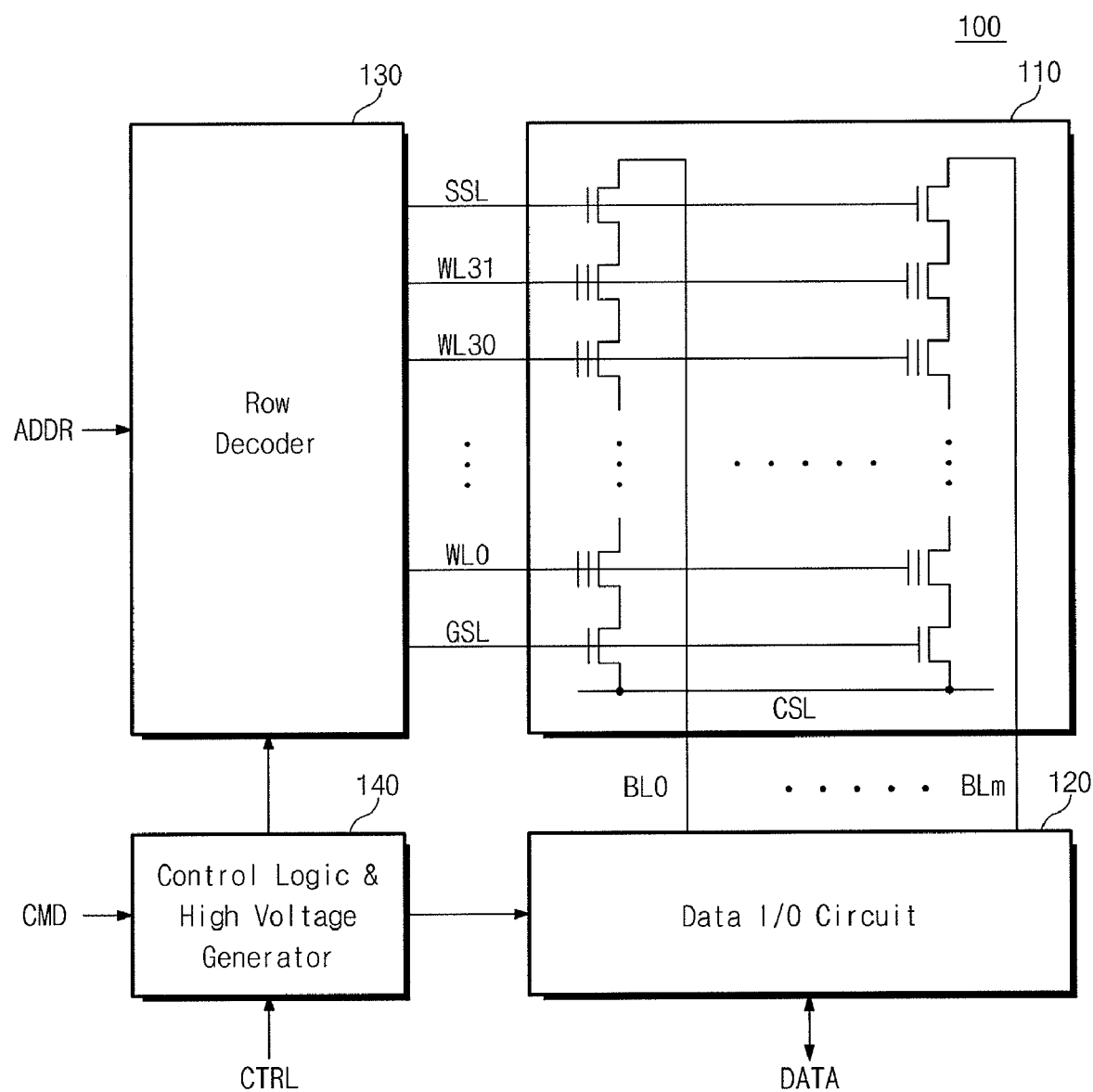
FIG. 2 is a block diagram showing a flash memory device illustrated in FIG. 1.

FIG. 2 is a block diagram showing a flash memory illustrated in FIG. 1. Referring to FIG. 2, a flash memory 100 may include a memory cell array 110, a data input/output circuit 120, a row decoder 130, and a control logic & high voltage generator circuit 140.

The memory cell array 110 has a plurality of memory blocks, each of which includes of a plurality of pages. Each of the pages is formed of a plurality of memory cells. Each of the memory cells may store single-bit data or multi-bit data. The flash memory 100 may conduct an erase operation one full block at a time and a read or write operation may be conducted one full page at a time.

One memory block is illustrated in FIG. 2. for the purposes of simplicity. Referring to FIG. 2, a memory block includes string select transistors connected to a string select line SSL, memory cells connected to word lines WL0 to WL31, and ground select transistors connected to a ground select line GSL. The string select transistors are connected to corresponding bit lines BL0 to BLm, and the ground select transistors are connected in common to a common source line CSL.

At a read operation of the flash memory 100, a power supply voltage VCC is applied to the string and ground select lines SSL and GSL, a select read voltage Vrd is applied to a selected word line (e.g., WL8), and an unselect read voltage Vread is applied to unselected word lines WL0 to WL7 and WL9 to WL31. Herein, the unselect read voltage Vread is a voltage sufficiently high as to turn on memory cells connected with the unselected word lines WL0 to WL7 and WL9 to WL31.

The data input/output circuit 120 is connected with the memory cell array 110 via the plurality of bit lines BL0 to BLm. The data input/output circuit 120 may receive data via data input/output lines (not shown). The input data may be stored in corresponding memory cells. Meanwhile, the data input/output circuit 120 may read out data stored in memory cells via bit lines, and the read-out data may be output to the external via the data input/output lines.

The row decoder 130 is connected to the memory cell array 110 via the plurality of word lines WL0 to WL31. The row decoder 130 receives an address ADDR to select a memory block or a page. Herein, an address for selecting a memory block is called a block address, and an address for selecting a page is called a page address.

The control logic and high voltage generator circuit 140 may control the data input/output circuit 120 and the row decoder 130 in response to a command CMD and control signals CTRL. Herein, the control signals CTRL may be provided from a memory interface 210 (refer to FIG. 1) or a memory controller 712 (refer to FIG. 6). The control logic and high voltage generator circuit 140 may generate bias voltages that are provided to word lines at a write, read, or erase operation.

At a read operation, the control logic and high voltage generator circuit 140 may generate a select read voltage Vrd to be supplied to a selected word line and an unselect word voltage Vread to be supplied to unselected word lines. In general, the unselect read voltage Vread may have a voltage level higher than the select read voltage Vrd.

Figure 3:
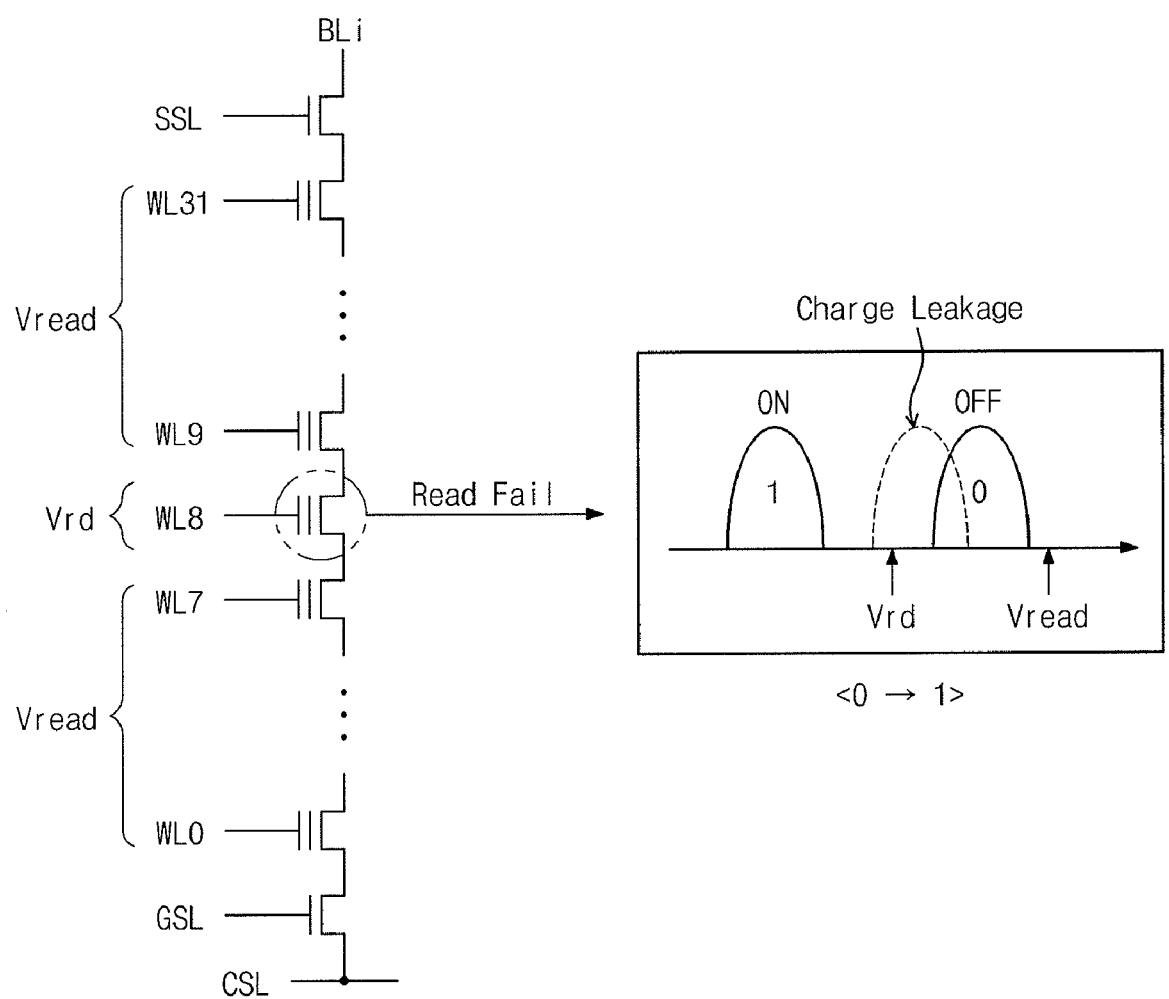
FIG. 3 is a diagram for describing read fail due to charge leakage of a flash memory device.

FIG. 3 is a diagram for describing read fail due to charge leakage of a flash memory device. A read fail due to charge leakage is a read error in which cells programmed with data '0' are read to have data '1'. As a result of a read fail due to charge leakage, OFF cells may be read as ON cells due to charge leakage.

Referring to FIG. 3, a ground select transistor, a plurality of memory cells, and a string select transistor are connected in series between a common source line CSL and a bit line BLi. The ground select line GSL is connected to the ground select transistor, and the word lines WL0 to WL31 are connected to the memory cells, respectively. The string select line SSL is connected with the string select transistor.

At a read operation, a select read voltage Vrd (e.g., about 0V) is applied to a selected word line (e.g., WL8), and an unselect read voltage Vread (e.g., about 4.5V) is applied to unselected word lines WL0 to WL7 and WL9 to WL31, respectively. Herein, the unselect read voltage Vread is a voltage sufficiently high to turn on memory cells connected with the unselected word lines WL0 to WL7 and WL9 to WL31.

Read fail may arise due to charge leakage. As memory cells suffer repetitive program/erase operations, oxide films of the memory cells may be deteriorated. This enables electrons trapped at a floating gate or an oxide film of a memory cell to be shifted into a channel via the oxide film thereof.

Leaking of trapped electrons into a channel lowers a threshold voltage of a memory cell. Accordingly, as illustrated in FIG. 3, a threshold voltage distribution of OFF cells may be shifted into a threshold voltage distribution of ON cells. If a threshold voltage of an OFF cell is lowered below the select read voltage Vrd, an OFF cell may be read as an ON cell at a read operation. Accordingly memory cells programmed with data '0' are read to have data '1'.

It is possible to detect read fail due to charge leakage by analyzing error correction code. A memory controller 200 (refer to FIG. 1) may detect whether a read fail arises due to the charge leakage, based upon ECC analysis, which is more fully described below.

Figure 4:
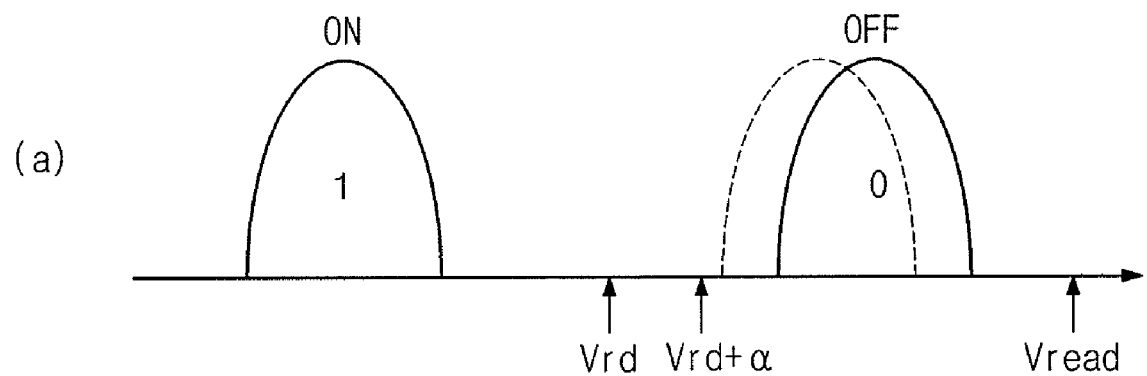
FIG. 4 is a diagram showing shifts of a threshold voltage distribution according to the extent of charge leakage.
Figure 4:
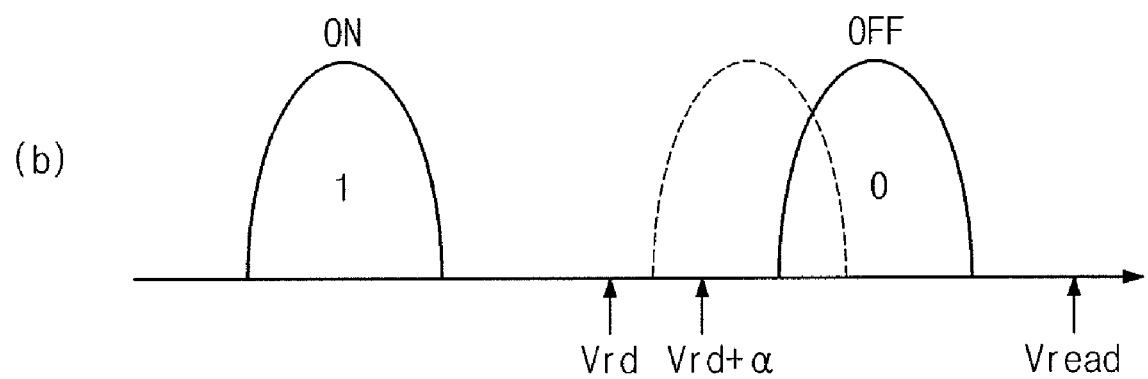
Figure 4:
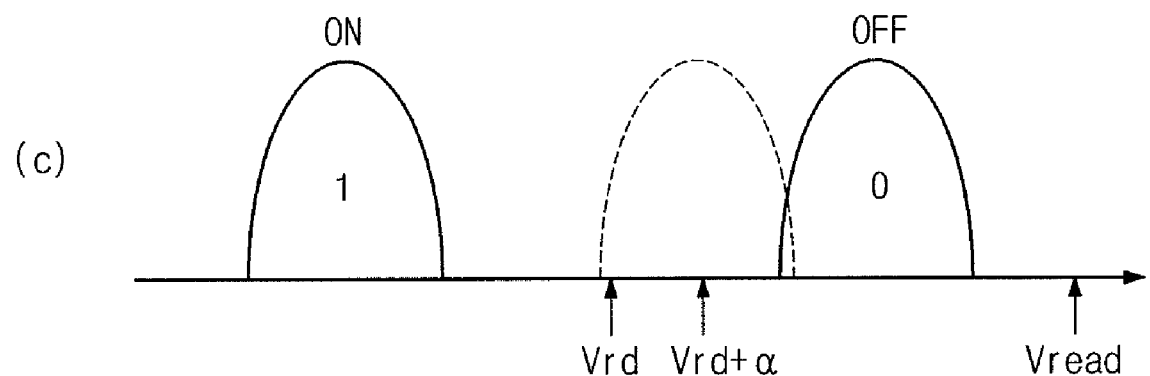

FIG. 4 is a diagram showing shifts of a threshold voltage distribution according to the extent of charge leakage. A non-volatile memory device according to an exemplary embodiment of the present invention may perform a read operation twice in order to prevent read fail due to charge leakage.

At a first read operation, a first select read voltage Vrd+α is applied to a selected word line, and an unselect read voltage Vread is applied to unselected word lines, respectively. At a second read operation, a second select read voltage Vrd is applied to the selected word line, and the unselected read voltage is applied to the unselected word lines, respectively.

Herein, the second select read voltage Vrd is a read voltage that is conventionally used as illustrated in FIG. 3. The first select read voltage Vrd+α is a voltage applied to prevent read fail due to charge leakage and has a level lower by αV than the second select read voltage Vrd. The voltage of αV may be defined as a voltage sufficient to secure a read margin.

FIG. 4A shows the case in which a threshold voltage of a programmed cell is shifted nearly up to the first read voltage Vrd+α. When a memory cell is programmed, its threshold voltage may be higher than the first select read voltage Vrd+α. A threshold voltage distribution of memory cells illustrated in FIG. 4A indicates that sufficient read margin is secured. In a read method of a non-volatile memory device according to an exemplary embodiment of the present invention, it is assumed that memory cells illustrated in FIG. 4A are considered to be free from read fail due to charge leakage.

FIG. 4B shows the case in which a threshold voltage of a programmed cell is shifted between a first select read voltage Vrd+α and a second select read voltage Vrd due to charge leakage. When a memory cell is programmed, its threshold voltage may be higher than the first select read voltage Vrd+α. Memory cells in a threshold voltage distribution in FIG. 4B may have high probability of a subsequent read fail. A read method of a non-volatile memory device according to an exemplary embodiment of the present invention may find memory cells illustrated in FIG. 4B and to prevent read fail due to charge leakage.

FIG. 4C shows the case in which a threshold voltage of a memory cell is shifted below the second read voltage Vrd. When a memory cell is programmed, its threshold voltage may be higher than the second select read voltage Vrd. Memory cells having a threshold voltage distribution in FIG. 4C suffer read fail. In this case, cells programmed with data '0' are read to have data '1'. Thus, exemplary embodiments of the present invention are directed to preventing previously programmed cells from having a threshold voltage distribution illustrated in FIG. 4C.

Figure 5:
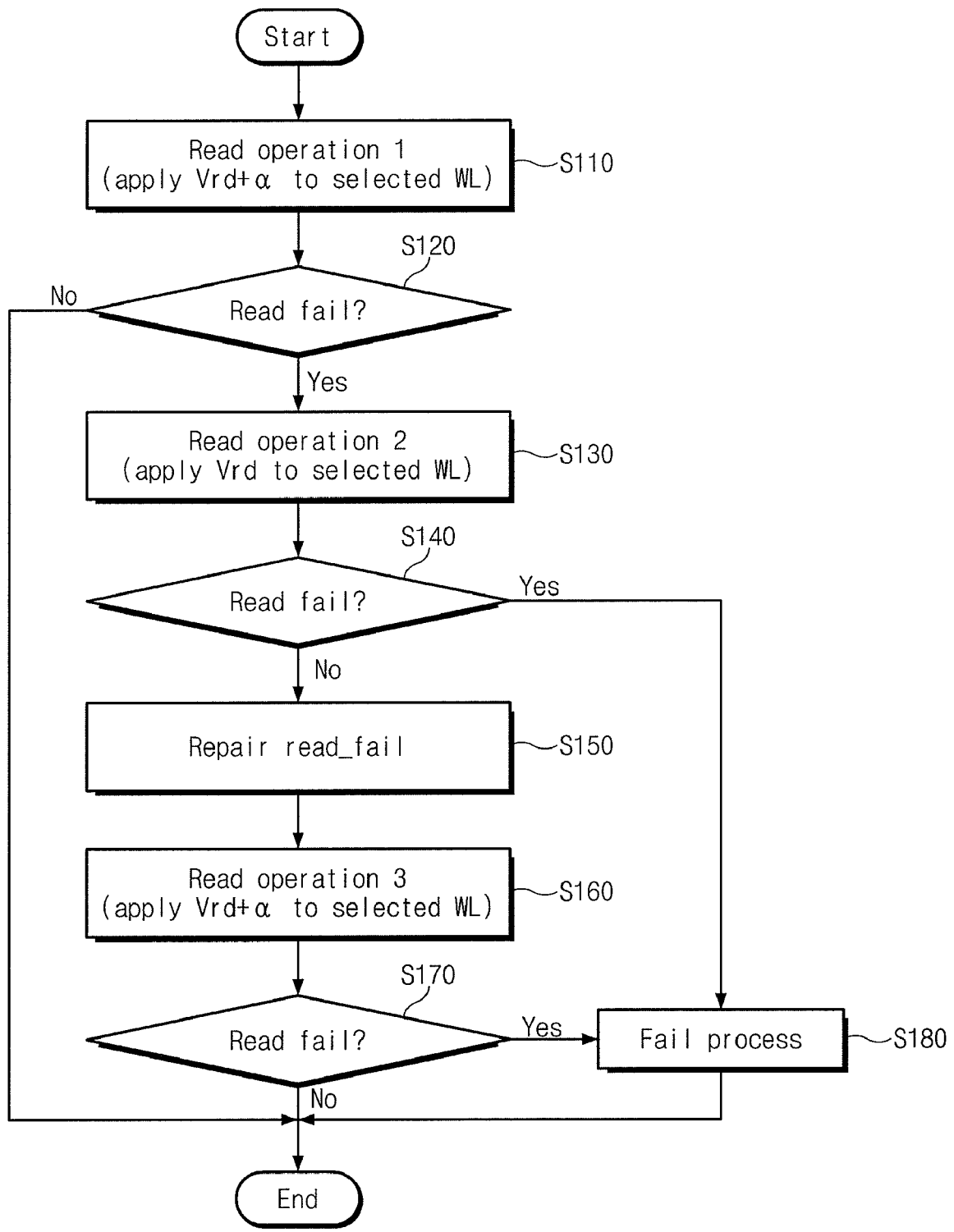
FIG. 5 is a flow chart showing a read method of a non-volatile memory device according to an exemplary embodiment of the present invention.

FIG. 5 is a flow chart showing a read method of a non-volatile memory device according to an exemplary embodiment of the present invention. A read method of a non-volatile memory device according to an exemplary embodiment of the present invention will be more fully described with reference to FIGS. 2 and 5. The non-volatile memory device 100 according to an exemplary embodiment of the present invention may perform a read operation one or more times based upon shift of a threshold voltage distribution due to charge leakage.

In step S110, the non-volatile memory device 100 performs a first read operation where a first select read voltage Vrd+α is supplied to a selected word line. At the first read operation, the first select read voltage is supplied to the selected word line (e.g., WL8), and an unselect read voltage Vread is applied to unselected word lines, respectively.

In step S120, the non-volatile memory device 100 may check for the presence of a read fail that arises at the first read operation. If a result indicates that no read fail arises (No, Step S120), then the read operation is ended. But, if a result indicates that read fail arises (Yes, Step S120), then the procedure goes to step S130. As used herein, a statement that "no read fail arises" may mean that a threshold voltage distribution of memory cells has sufficient margin. Accordingly, threshold voltages of memory cells may be higher than the first select read voltage Vrd+α as illustrated in FIG. 4A.

The read fail may be checked by various methods. For example, it is possible to check for a cause of the read fail due to charge leakage using error correction code (ECC). If a result of checking ECC indicates that the non-volatile memory device 100 reads data '0' as data '1', the read fail is judged to arise due to charge leakage. The check result corresponds to read pass in a case in which threshold voltages of memory cells are shifted as illustrated in FIG. 4A and to read fail in a case in which threshold voltages of memory cells are shifted as illustrated in FIGS. 4B and 4C.

In step S130, the non-volatile memory device 100 may perform a second read operation. At the second read operation, a second select read voltage Vrd is applied to the selected word line (e.g., WL8), and the unselect read voltage Vread is applied to unselected word lines, respectively.

In step S140, the non-volatile memory device 100 may check for a read fail that arises at the second read operation. If a result of the check indicates that read fail exists (Yes, Step S140), then in step S180, the read operation is treated as read fail. Herein, if the read fail arises, there exist cells whose threshold voltages are lowered below the second select read voltage Vrd as illustrated in FIG. 4C.

But, if the result indicates that no read fail arises (No, Step S140), then the procedure goes to step S150. Herein, read pass having no read fail corresponds to the case that programmed cells have threshold voltages between the first select read voltage Vrd+α and the second select read voltage Vrd as illustrated in FIG. 4B.

In step S150, the read fail is recovered. Memory cells in a threshold voltage distribution illustrated in FIG. 4B may be recovered by a reprogram operation or a copyback program operation. The reprogram operation is an operation of again programming memory cells that are read via the first or second read operation. Exemplary embodiments of the present invention may prevent the read fail due to charge leakage by reprogramming memory cells suffering the charge leakage.

It is possible to conduct the copyback program operation instead of the reprogram operation. With the copyback program operation, there are programmed memory cells different from memory cells that suffer a read operation. The read fail is basically recovered since there are programmed memory cells different from memory cells that suffer the read fail.

In accordance with the read method of the non-volatile memory device of an exemplary embodiment of the present invention, after the read fail is cured (Step S150), a third read operation may be additionally conducted (Step S160). In step S160, the non-volatile memory device 100 may perform the third read operation. At the third read operation, the first select read voltage is applied to the selected word line (e.g., WL8), and the unselect read voltage Vread is supplied to unselected word lines, respectively.

In step S170, the non-volatile memory device 100 may check whether a read fail arises at the third read operation. If no read fail arises (No, Step S170), then the procedure is ended. If the read fail is detected (Yes, Step S170), then the procedure goes to step S180. Accordingly, if the read fail is detected at the third read operation (Yes, Step S170), then the read operation is treated as read fail (Step S180).

Exemplary embodiments of the present invention are able to be applied to an SLC flash memory device for storing single-bit data per cell or an MLC flash memory device for storing multi-bit data per cell. Further, exemplary embodiments of the present invention may be applied to a flash memory device of a combo structure where it has SLC and MCL areas at the same time.

Figure 6:
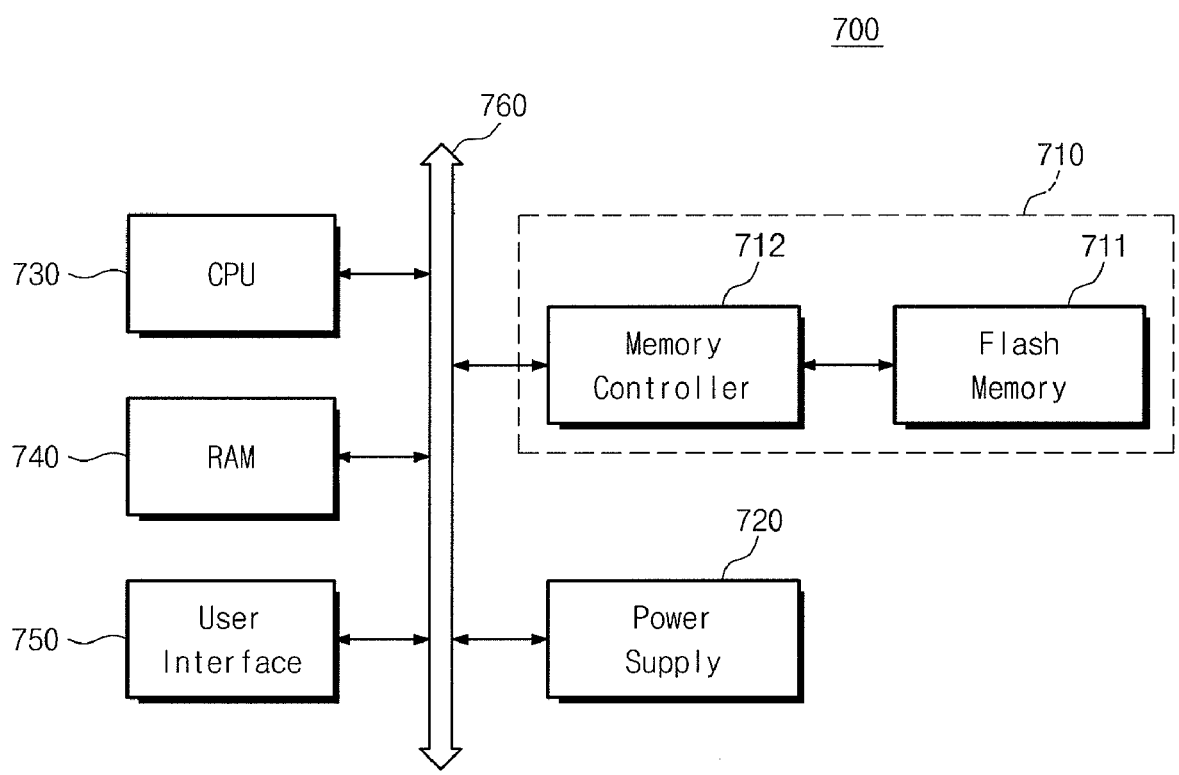
FIG. 6 is a block diagram showing a memory system including a non-volatile memory device according to an exemplary embodiment of the present invention.

FIG. 6 is a block diagram showing a memory system including a non-volatile memory device according to an exemplary embodiment of the present invention. Referring to FIG. 6, a memory system 700 may include a non-volatile memory device 710, a power supply 720, CPU 730, RAM 740, and a user interface 750, which are connected with a bus 760.

The non-volatile memory device 710 may include a flash memory 711 and a memory controller 712. The non-volatile memory device 710 may be embodied using a flash memory product or in an integrated circuit such as One NAND™. The flash memory 711 receives a read command and an address from the memory controller 712. The flash memory 711 analyzes ECC or controls levels of select and unselect read voltages Vrd and Vread.

The non-volatile memory device 710 is connected with the power supply 720, the CPU 730, the RAM 740, and the user interface 750 via the system bus 760. The flash memory 711 may store data provided via the user interface 750 or data processed by the CPU 730 under the control of the memory controller 712.

Meanwhile, the non-volatile memory device 710 in FIG. 6 may be used as a Solid State Disk (SSD) or applied to application chipset, camera image processor, and the like.

The non-volatile memory device according to exemplary embodiments of the present invention may be packed using various types of packages. For example, the flash memory and/or the memory controller according to exemplary embodiments of the present invention may be packed by packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the disclosure is intended to cover all such modifications, enhancements, and other embodiments, which fall within the true spirit and scope of the present invention.

What is claimed is:

1. A method for performing a read operation in a non-volatile memory device, comprising:
    performing a first read operation in which a first read voltage is applied to a selected word line;
    wherein when a read fail arises at the first read operation, a second read operation is performed in which a second read voltage lower than the first read voltage is applied to the selected word line; and
    when no read fail arises at the second read operation, the read fail generated at the first read operation is cured by performing a program operation.

2. The read method of claim 1, further comprising:
    after curing the read fail generated at the first read operation, a third read operation is conducted in which the first read voltage is applied to the selected word line and a check is performed to determine whether a read fail arises at the third operation.

3. The read method of claim 1, wherein the program operation is carried out with respect to memory cells that have received the first and second read voltages during the first and second read operations.

4. The read method of claim 1, wherein the program operation is carried out with respect to memory cells that have not received the first and second read voltages during the first and second read operations.

5. The read method of claim 4, wherein the program operation includes a copyback program operation.

6. The read method of claim 1, further comprising:
    when a read fail arises at the second read operation, memory cells that have received the first and second read voltages during the first and second read operations are set to a read fail.

7. The read method of claim 1, wherein the read fail arising at the first read operation is caused due to charge leakage of memory cells.

8. The read method of claim 1, wherein the non-volatile memory device is a NAND flash memory device.

9. A non-volatile memory device comprising:
    a memory cell array for storing data;
    a read voltage generator for providing a read voltage to a selected word line; and
    a control unit for controlling the read voltage generator,
    wherein the control unit performs a first read operation by controlling the read voltage generator so as to supply a first read voltage to the selected word line;
    wherein when a read fail arises at the first read operation, the control unit performs a second read operation by controlling the read voltage generator so as to provide a second read voltage lower than the first read voltage to the selected word line; and
    wherein when no read fail arises at the second read operation, the control unit cures the read fail generated at the first read operation by performing a program operation.

10. The non-volatile memory device of claim 9, wherein after curing the read fail generated at the first read operation, the control unit conducts a third read operation in which the first read voltage is applied to the selected word line and checks whether a read fail arises at the third operation.

11. The non-volatile memory device of claim 9, wherein the program operation is carried out with respect to memory cells that have received the first and second read voltages during the first and second read operations.

12. The non-volatile memory device of claim 9, wherein the program operation is carried out with respect to memory cells that have not received the first and second read voltages during the first and second read operations.

13. The non-volatile memory device of claim 12, wherein the program operation includes a copyback program operation.

14. The non-volatile memory device of claim 9, wherein when a read fail arises at the second read operation, the control unit sets memory cells that have received the first and second read voltages during the first and second read operations, to a read fail.

15. The non-volatile memory device of claim 9, wherein the read fail arising at the first read operation is caused due to charge leakage of memory cells.

16. The non-volatile memory device of claim 9, wherein the memory cell array has a cell string structure.

17. A memory system comprising:
a non-volatile memory device; and
a memory controller for controlling the non-volatile memory device,
wherein the non-volatile memory device performs a first read operation by supplying a first read voltage to a selected word line during a read operation;
wherein when a read fail arises at the first read operation, the non-volatile memory device performs a second read operation by providing a second read voltage lower than the first read voltage to the selected word line; and
wherein when no read fail arises at the second read operation, the non-volatile memory device cures the read fail generated at the first read operation by performing a program operation.

18. The memory system of claim 17, wherein after curing the read fail generated at the first read operation, the non-volatile memory device performs a third read operation in which the first read voltage is applied to the selected word line and performs a check to determine whether a read fail arises at the third operation.

19. The memory system of claim 17, wherein the program operation is carried out with respect to memory cells that have not received the first and second read voltages during the first and second read operations.

20. The memory system of claim 17, wherein the non-volatile memory device and the memory controller is within a single integrated circuit.

* * * * *